United States Patent
Reymann et al.

(10) Patent No.: US 8,722,506 B2
(45) Date of Patent: May 13, 2014

(54) PRODUCTION OF HIGH ALIGNMENT MARKS AND SUCH ALIGNMENT MARKS ON A SEMICONDUCTOR WAFER

(75) Inventors: Steffen Reymann, Erfurt (DE); Gerhard Fiehne, Grossrudestedt (DE); Uwe Eckoldt, Hohenfelden (DE)

(73) Assignee: X-Fab Semiconductor Foundries AG, Erfurt (DE)

(*) Notice: Subject to any disclaimer, the term of this patent is extended or adjusted under 35 U.S.C. 154(b) by 0 days.

(21) Appl. No.: 13/139,002

(22) PCT Filed: Dec. 23, 2009

(86) PCT No.: PCT/IB2009/055935
§ 371 (c)(1),
(2), (4) Date: Aug. 23, 2011

(87) PCT Pub. No.: WO2010/073226
PCT Pub. Date: Jul. 1, 2010

(65) Prior Publication Data
US 2012/0032356 A1    Feb. 9, 2012

(30) Foreign Application Priority Data
Dec. 24, 2008   (DE) .................. 10 2008 063 156

(51) Int. Cl.
*H01L 21/76*   (2006.01)
(52) U.S. Cl.
USPC ........................... 438/401; 438/462; 438/975
(58) Field of Classification Search
None
See application file for complete search history.

(56) References Cited

U.S. PATENT DOCUMENTS

| | | | |
|---|---|---|---|
| 3,969,751 A | 7/1976 | Drukaroff et al. | |
| 4,327,292 A | 4/1982 | Wang et al. | |
| 4,785,338 A | 11/1988 | Kinoshita et al. | |
| 5,031,017 A | 7/1991 | Pernyeszi et al. | |
| 5,525,840 A * | 6/1996 | Tominaga | 257/797 |
| 6,030,897 A * | 2/2000 | Deconinck | 438/691 |
| 6,103,456 A * | 8/2000 | Tobben et al. | 430/317 |
| 6,146,969 A * | 11/2000 | Tan et al. | 438/401 |
| 6,153,492 A | 11/2000 | Wege et al. | |

(Continued)

FOREIGN PATENT DOCUMENTS

DE     10259322 B4   12/2005
EP     1 912 257 A2   4/2008

OTHER PUBLICATIONS

International Search Report; International Application No. PCT/IB2009/055935.

*Primary Examiner* — David E Graybill
(74) *Attorney, Agent, or Firm* — Hunton & Williams LLP

(57) ABSTRACT

The invention relates to production of alignment marks on a semiconductor wafer with the use of a light-opaque layer (17), wherein, before the light-opaque layer (17) is applied, by means of the etching of cavities, free-standing pillar groups are produced in the cavities and then the light-opaque layer (17) is applied. The pillars are produced with a height of above 1 μm, which, moreover, is greater than a thickness of the light-opaque layer (17) to be applied in the cavities as layer portions (17*x*; 17*y*). The cavities are formed with a width such that they are filled only partly with the layer portions (17*x*; 17*y*) when the light-opaque layer (17) is applied. The high, freely positioned alignment marks produced by the method as pillar series (16*x*; 16*y*), having a plurality of individual pillars (16*a*; 16*a*') in a cavity (12*a*, 12*y*), of a scribing trench on the semiconductor wafer are likewise described.

27 Claims, 4 Drawing Sheets

(56) References Cited

U.S. PATENT DOCUMENTS

| | | | |
|---|---|---|---|
| 6,288,454 B1* | 9/2001 | Allman et al. | 257/797 |
| 6,303,458 B1* | 10/2001 | Zhang et al. | 438/401 |
| 6,326,309 B2* | 12/2001 | Hatanaka et al. | 438/693 |
| 6,660,612 B1* | 12/2003 | Chang et al. | 438/401 |
| 6,713,884 B2* | 3/2004 | Weis | 257/797 |
| 6,825,096 B2* | 11/2004 | Weis | 438/401 |
| 8,268,696 B2* | 9/2012 | Summerfelt et al. | 438/401 |
| 8,324,742 B2* | 12/2012 | Summerfelt et al. | 257/797 |
| 8,357,890 B2* | 1/2013 | Chen et al. | 250/226 |
| 2003/0030055 A1 | 2/2003 | Nakano et al. | |
| 2003/0119274 A1 | 6/2003 | Weis | |
| 2004/0032518 A1 | 2/2004 | Benjamin et al. | |
| 2004/0152270 A1* | 8/2004 | Weis | 438/268 |
| 2007/0176128 A1 | 8/2007 | Van Bilsen et al. | |
| 2008/0077362 A1* | 3/2008 | Willis et al. | 702/189 |
| 2008/0085599 A1 | 4/2008 | Van Haren et al. | |
| 2009/0081813 A1* | 3/2009 | Aguado Granados et al. | 438/7 |
| 2009/0243122 A1 | 10/2009 | Summerfelt | |
| 2010/0301483 A1 | 12/2010 | Gaebler | |
| 2011/0108715 A1* | 5/2011 | Chen et al. | 250/227.2 |
| 2011/0291139 A1* | 12/2011 | Chiu et al. | 257/98 |
| 2012/0032356 A1* | 2/2012 | Reymann et al. | 257/797 |

* cited by examiner

1  Substrate
2  Single Layer
3  Photo resist
4  Conventional positioning mark (alignment mark).
   Typical height of the projection is smaller then 1μm.
   Its breadth is 4μm each.
   An alignment mark 4 is formed out of several parallel rows of projections orientated in the direction of extension of the trench (cavity 2a).

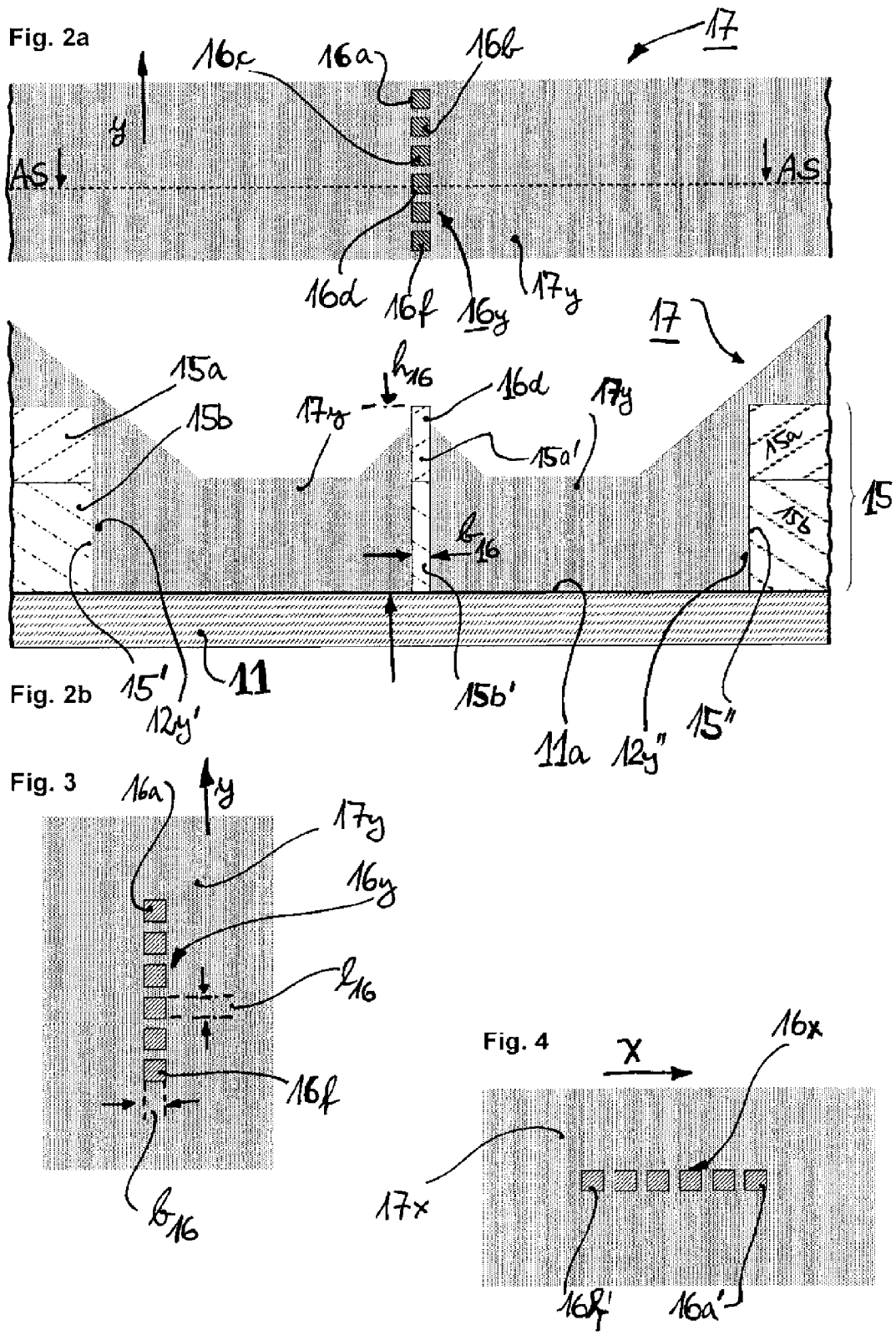

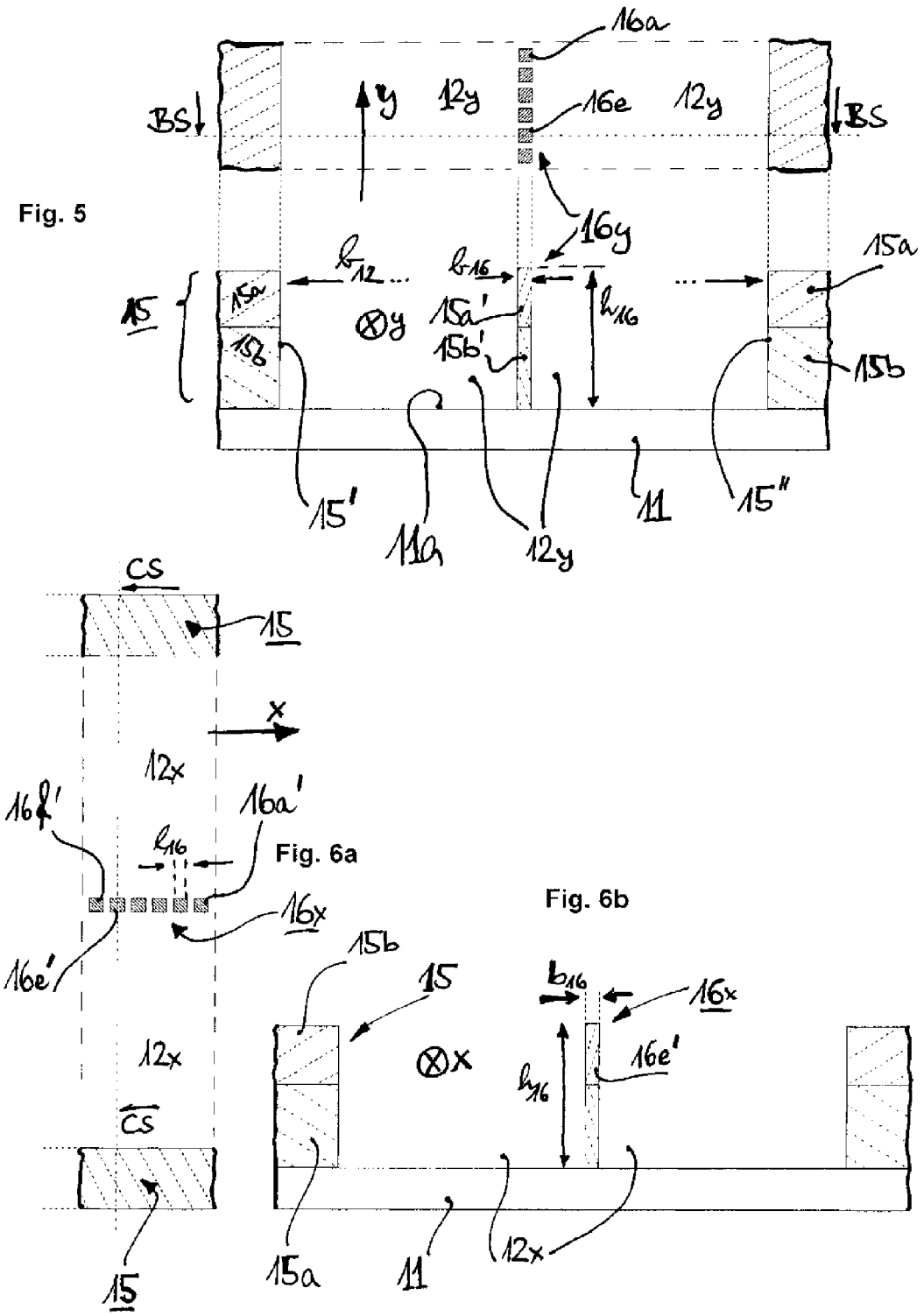

PRODUCTION OF HIGH ALIGNMENT MARKS AND SUCH ALIGNMENT MARKS ON A SEMICONDUCTOR WAFER

CROSS-REFERENCE TO RELATED APPLICATIONS

The application is a U.S. National Stage Application of International Application of PCT/IB2009/055935 filed Dec. 23, 2009, which claims the benefit of German Patent Application No. 10 2008 063 156.6 filed Dec. 24, 2008, the disclosures of which are herein incorporated by reference in their entireties.

FIELD OF THE DISCLOSURE

The invention relates to a method for the production of at least one alignment mark in a light-opaque layer on a semiconductor wafer, there, for positioning (alignment) and arranged in at least one scribing trench area. Also concerned is an alignment mark which has been produced according to the method. It is, on the one hand, directly described as a result of the method steps and, on the other hand, it is also protected by the production and the use of the method.

BACKGROUND OF THE DISCLOSURE

The described light-opaque layer (or light-absorbing layer) is, for example, a black, light-sensitive lacquer. Such light-absorbing layer protects, therein, for example light-sensible areas of circuits with optically integrated elements against incident light, and this layer is, preferably, structured. Examples for black photo resists are carbon-based black resist or pigment-based black resist which both can be used as light-absorbing layer (light shield). This layer is applied at least at the end of the production process onto a passivation layer. It concerns a non-transparent negative photo resist having planarizing properties.

A lacquer having a defined thickness, can also equalize the existing surface topography (small recesses or cavities are filled up with this lacquer). The result will then be a planar surface such that usual alignment marks cannot be recognized anymore by alignment optics because of the substantial covering height of the surfaces of the alignment marks (or of all projections of a respective alignment mark).

Because of the application of a light-opaque layer to be structured at the end of the production process, this layer covers circuits which have previously be inserted into the active areas of the semiconductor-wafer, and can, therein, further on protect the light-sensitive areas there, where no structuring is made, or can make accessible for the light certain light-sensitive areas as optical sensors (optically active elements) in the integrated circuits after the structuring, whereas it can protect other areas against incident light because of the on-going presence of the layer.

Light-opaque, for example shielding layers, so-called black, light-sensitive lacquers or "light-shield-photo resists", as well as optical protection layers are applied in sensors and circuits of the semiconductor industry, according to their characteristics. The light-layer protects, thereby, for example light-sensitive areas of circuits outside of windows (introduced openings) in a structured, light-absorbing layer. The circuits may respectively be provided with one or several integrated optical element(s). The areas outside of the active optical elements may be protected against incident light. The light-absorbing layer may, however, being generally associated with circuits without optical elements within which light-sensitive areas are to be protected. The protection relates, therein, for example to the suppression of parasitic influences of a light incident onto the circuits. This light protection layer is, for example, produced as originally plain metal-, photo resist, or plastic layer which has reflective and/or absorbing properties depending on the materials used, and which may be structured during the processing sequence.

U.S. Pat. No. 3,969,751 (Drukaroff, RCA) describes a light-absorbing (or light-shielding) layer, for example out of blackened photo resist, blackened metal or plastics which contains carbon particles. The use of a light-absorbing layer in sensors is described, among others in U.S. Pat. No. 4,785,338 (Kinoshita, Canon). For producing this layer, materials like epoxy resin, silicone resin, urethane resin and a kind of black colour or black colouring agent are used.

US 2003/0030055 A1 (Nakano et al.) describes a colour filter containing a light-absorbing layer out of epoxy resin with black pigments. An opaque layer out of light-absorbing, black carbon particles and out of reflective titanium dioxide particles for integrated circuits is described in U.S. Pat. No. 5,031,017 (Pernyeszi, H P).

From US 2004/0032518 A1 (Benjamin, Tower Semiconductor), a light-shielding, structured layer is known with picture sensors wherein this layer contains a light-sensitive lacquer with carbon particles.

Known alignment marks for transparent photo resists consist mostly out of a layer (single layer) for example out of oxide, oxy-nitride or nitride. However, also combinations out of these are perceivable. They are always totally covered by the transparent photo resist. The photo resist protects, thereby, also the alignment marks against etching attacks. FIG. 1 shows the principle of such a projecting alignment mark having a plurality of projections which are arranged in the longitudinal direction of a cavity in the cavity.

In many cases, the structured layers are transparent to light or they are, like the photo resist, transparent at the wavelength of the alignment optics. Thereby, the alignment marks can be optically detected through the photo resist or the structured layer. A general problem with light-absorbing layers is, however, the exact alignment of these layers with respect to prior layers since the photo resists containing carbon or pigments are not transparent in the range of wavelengths of the visible light (350 nm to 800 nm).

In case alignment marks are placed in light-opaque materials, like metal of poly silicone, they cannot be recognized by the alignment optics so that the pinpointed Alignment of these layers to the prior layer is not possible. One manages this with a corresponding surface topography for the application of the at least light-absorbing layers to be structured which is transferred in the shape of a groove in exactly this layer and remains recognizable for the alignment optics.

U.S. Pat. No. 6,153,492 (Wege/Lahnor, Infineon) describes, in this respect, a method for putting up the contrast of alignment marks by depositing and reverse planarizing a tungsten layer. Therein, the trenches around the alignment marks are etched free, for example, back-etched, in an additional step. The depressions formed in this way, are transferred into a subsequently deposited aluminium layer. A modification also stated in the U.S. Pat. No. 6,153,492 includes a back-etch of the oxide layer surrounding the trenches. The tungsten layer now projects beyond the surface of the oxide layer and forms an edge for the exposure of a subsequently deposited aluminium layer.

DE 102 59 322 B4 (Infineon) describes a method for forming an alignment mark in a light-opaque layer on a semiconductor wafer. Therein, trenches having different depths and breadths are formed in the semiconductor substrate that are filled with a first layer. Trenches having a small breadth and depths are completely filled, and trenches having a larger breadth and depth are filled only partly. The latter ones are the trenches for the alignment marks. Thereafter, a second layer is deposited with such a thickness which now also completely fills the trenches of the alignment marks. Therein, the second layer comprises a selectivity in the etching process with respect to the first layer. It follows a chemical-mechanical polishing process in order to achieve a plain surface.

Thereafter, the second layer which is now only present in the trenches with the larger breadth and depth (the trenches of the alignment marks) are etched in an etching process such that these trenches contain new cavities. Since the etching rate of the second layer is by a multiple larger than the one of the first layer, the back-etch depth of other areas of the substrate surface is comparatively small. If now a light-opaque layer is deposited, the new cavities are transferred to the light-opaque layer in case of a sufficient conformity and an adapted thickness of the layer. The position of the cavities can now be recognized by means of alignment optics as alignment mark. This method requires at least one additional layer as well as at least one additional etching step and a polishing process.

SUMMARY OF THE DISCLOSURE

The invention is based on the objective to provide a simple and cost effective method for the production of alignment marks in an semiconductor wafer with an at least light-opaque or light-absorbing layer which can do without auxiliary layers and additional process steps, wherein alignment marks are intended to be produced which can be recognized by an exposure system (or alignment optics).

For achieving this objective, the inventive method for the production of at least one alignment mark on a semiconductor wafer by using a light-opaque layer for (later) structuring or for (permanent) protection of circuit elements is proposed. Furthermore, a semiconductor wafer is proposed having at least one alignment mark in a scribing trench area (scribe line), in particular at least one or several group(s) out of respective at least two mutually vertical pillar groups within mutually perpendicular scribing trench areas (in x- and y direction). This includes that also the two pillar groups of a group are aligned perpendicular with respect to each other.

The claimed method achieves to apply the light-absorbing layer on a wafer having a plurality of mutually delimited, integrated circuits without losing the possibility to recognise the wafer in its position by means of optical detection of alignment marks (in an exposure system or by alignment optics) and to position, thereby, the wafer, for example for depositing a further layer or for further alignment of a photo masc. The pinpointed positioning of, for example, a following layer with respect to the prior layer is possible in spite of the usage of the deposited, light-absorbing layer which covers light-sensible areas of the circuits—in the delimited, integrated circuits—, or which, as an alternative, sets free after a further structuring, light-sensitive areas in the circuits for incident light but which, in the rest of the areas outside of the light-sensitive active elements, further on covers against incident light.

For example, the light-opaque layer is applied at the end of a production process on a passivation layer, wherein this deposited layer includes the area of the scribing trenches between the integrated circuits as well as covers the active surface areas of the semiconductor wafer.

Preferably, the scribing trenches are as narrow as possible in order to be able to use the wafer surface with active area in an optimal way for circuits to be inserted therein, in the cavities of the scribing trenches, the alignment marks are placed such that an alignment mark extends along the longitudinal direction of a cavity in the scribing trench. The cavity forms the lowered portion in the scribing trench within which a respective alignment mark is arranged, and has a distance from the edges of the lowered area.

Since X as well as Y scribing trenches are present and an alignment mark is inserted into the X and Y cavity, these two alignment marks extend in two mutually perpendicular directions (x/y direction).

One alignment mark in the X direction and one alignment mark in the Y direction each belong functionally together and is here called "logical alignment mark". It is also arranged in a spatial area and consists of two mutually perpendicular pillar rows which are, however, not arranged at the same location but in a certain, functionally delimited area.

The two mutually perpendicular pillar groups are functionally associated as a logical alignment mark for the alignment optics or the exposure system.

Also a plurality of pairs of orthogonal, functionally associated pillar groups can be formed, however, each pillar group extends along the cavity within which it is arranged.

The cavity itself is not a complete cavity anymore after application of the light-opaque layer, but it is partly filled with the deposited layer or with the material of this layer, respectively. Since the cavity, however, has a—functionally described—minimum breadth, and since the pillar group (which forms the alignment mark) extends in the longitudinal direction of the cavity, the cavity is only partially filled, and the pillar group remains optically visible, for example, for the alignment optics. This is in spite of the light-opaque layer.

The surfaces of the individual pillars of the pillar row are not covered such that these surfaces cannot be optically recognized anymore by the above-mentioned alignment optics. This can then be in the sense that the surfaces of the individual pillars of the pillar group (associated with an alignment mark) remain free, i.e. are not covered by the light-opaque layer or a portion thereof or, however, a (parasitic) coverage is only so small that an optical detectability is maintained. A thickness not surpassing 200 nm is such a thickness which, because of its transmission still allows to detect the surfaces of the pillar row. However, the surface of the pillar row remains free and uncovered by the light-opaque layer which results wherefrom that the cavity has a minimum breadth and the pillar group has an associated height which is larger than the deposited thickness of the deposited, light-opaque layer such that the surfaces of the pillar group are not covered by the light-opaque layer. By non-coverage it is understood—as previously stated—also such a minor coverage which does not make impossible the optical detectability by the alignment optics or the exposure system.

A "light-obstructing" layer as a light-absorbing or light-opaque layer can be carbon-based. This carbon containing layer is, for example, a carbon-based black resist.

At least one alignment mark is produced in a scribing trench (in the longitudinally extending cavity thereof). Wherein, it is to be read on the X direction as well as on the Y direction, each individually. It may also be read such that, in case of two cavities, one alignment mark each is arranged in a respective cavity and this respective cavity is associated to a respective scribing trench wherein both scribing trenches are adjusted mutually perpendicular to each other. The two cited alignment marks (as pillar groups) would then be functionally associated with each other and form a "logical alignment mark" (consisting out of at least two physical alignment marks and these, each, out of a pillar group). Also a plurality of pairs of logical alignment marks can be arranged, however, not in such a way next to each other that several pillar groups in the same scribing trench in the same cavity are immediately next to each other and, thereby, each have a smaller distance from the inwardly facing walls of the cavity than each individual pillar. This would be a group of logical alignment marks.

In order to generally allow an alignment, sufficient light has to penetrate to the mark (alignment mark) such that this mark can be scanned and sufficient light is reflected which can be converted to an electrical signal in the exposure system and the spatial position of the alignment mark can be evaluated as a basis for a positioning of a further layer (automatically).

The alignment marks produced according to the invention are also recognizable when using light-opaque layers like non-transparent photo resists by means of the exposure system such that a pinpointed alignment of the wafer during the exposure is made possible and, thereby, the quality of a structuring process is put up. As an alternative, the alignment marks present in the cavity (in the scribing trench) can be used for adjusting a photo mask with respect to the prior layer. By means of this photo mask, the photo resist is exposed at certain areas and, thereby, developed such that the above-mentioned structuring is resulting. This also comes under the understanding of the improvement of the quality of a structuring process which is achieved naturally according to the pinpointed alignment by means of the at least one alignment mark, the logical alignment mark or a group of logical alignment marks.

A further advantage of the invention resides in that the method may be implemented in a simple way since existing methods (etching steps) are used in the process whereby the claimed process can be carried out cost-effectively and without additional effort. For example, the etching of the cavities (in the scribing trenches) may be carried out with the etching step for the passivation layer, which passivation and/or soft etching step is anyway present in the production method of the wafer.

The passivation may be part of the layer stack into which the cavities are etched and in which the pillars remain standing up. It may, however, also be located outside of the scribing trench in the rest of the active wafer area.

The layer stack may be formed, in an embodiment, out of an individual layer dielectric (intermediate layer dielectric-ILD), an intermediate metal dielectric (inter metal dielectric-IMD) or a passivation layer (pad oxide). This sequence of steps is etched as "layer stack" with a photo mask for forming the cavity.

At least one etching step for etching the layer stack is already used in the system for producing the wafer. Preferably, this etching step is provided for the passivation layer.

Also several etching steps may be taken depending on whether it is an oxide or a combination of oxide and nitride as layer stack. At least one or several thereof are such etching steps which are also used on the production of the wafer or, to put it in another way, anyway would have been used.

The etching time is adjusted such that it is etched down to the substrate by a corresponding surplus etching of the layer stack—for forming the cavity—and such that the pillar of the pillar group remains standing up in the cavity.

In an advantageous embodiment of the claimed method, the height of the pillar group is formed reaching down to the substrate of the wafer, wherein the alignment of the wafer in the following fabrication steps is always ensured. For forming the height of the single pillars of a pillar group and, thereby, also of the whole pillar group, the cavity or each cavity is etched around the respective pillar group and also around each individual pillar down to the substrate of the semiconductor wafer whereby the group of pillars in the cavity remains standing up. Silicon may be used as substrate of the wafer. This production of the pillar groups is true for the x direction as well as the y direction which are called, in the following, X cavity and X scribing trench and Y cavity and Y scribing trench respectively.

A further advantageous embodiment of the inventive method is characterized in that, after depositing the light-opaque layer, no planarization is carried out, whereby, at the one hand, a fabrication step is saved since it is redundant, and, on the other hand, a further damage of the pillars of each pillar group is avoided.

In further advantageous embodiments of the inventive method, the pillar groups are produced with the following dimensions: height of the pillars above 1 µm to 5 µm, preferably 3 µm, and length/breadth of 2 µm to 5 µm, preferably 4 µm. Pillar-like alignment marks are produced which, at the one hand, can be well recognized by the alignment optics and, on the other hand, are not only parasitically covered with the material of the light-opaque layer on the subsequent deposition of the light-opaque layer.

If a respective cavity is formed with a breadth dimension of at least 80 ρm, it is achieved with a high security that each pillar group usable as alignment mark, is not or only slightly covered with the material of the layer portion of the light-opaque layer related to the cavity on the subsequent deposition of the light-opaque layer. As such, the pillars out of this light-opaque material would protrude with their surfaces in the cavity.

A characterization of the breadth-dimension of the cavity can also be made relative to the breadth of the pillars in the pillar group in this cavity. The height of the pillars is, therein, above 1 µm such that they can be named with the term pillars. The light-opaque layer material in each cavity within which a pillar group is standing up, is, thereby, restricted in its filling height thereby that the minimum height of the pillars is, as functionally described, also put up like the breadth of the cavity. Outside of the cavity, this light-opaque layer is positioned on the wafer in its deposited thickness. It serves there to the (permanent) protection of a circuit element or is provided for a (later) structuring. It has there a preferred thickness between 0.8 µm and 2.5 µm.

The characterization of the relative breadth of the cavity is given with reference to a multiple of the breadth of the pillar group, the preferred breadth of essentially 4 µm of the pillar group results, by means of the factor 20, in the preferred breadth of the cavity. In a range of the breadth of the pillar between 2 µm and 5 µm, a breadth range between 40 µm and 100 µm results for the cavity.

Essentially one half of thereof is located on both sides of a presumed single mark in the cavity.

Preferably, the light-opaque surface is produced with a thickness of 0.8 µm to 2.5 µm (two-dimensionally outside of the cavity of the scribing trench). Thereby, it also penetrates the cavity, however, only to such a limit that the level of the light-opaque layer remains below the level of the surfaces of the pillars, whereby it is achieved with highest probability that the upper ends of the pillars remain free and can, thereby, be detected with certainty.

A further advantageous embodiment of the inventive method is characterized in that an area saving "single mark" is formed. The scribing trench area (scribe line) of the wafer can, thereby, be kept as narrow as possible in order to be able to use the wafer surface in an optimal way for chips. Two single marks are functionally defined and comprise a pillar group in x direction and a pillar group in y direction, however, not in the same location but in two mutually perpendicular cavities of two mutually perpendicular scribing trench areas. Two single marks comprise, therein, two pillar rows and would have to be understood as "logical alignment mark" as described above. The single mark comprises, however, also the statement that to left and to the right of a pillar group within the same cavity no further pillar groups are arranged. Thereby the breadth of the cavity is divided up into the left-hand side and the right-hand side of the pillar group which is also true for the other pillar group perpendicular thereto which is, together with the first mentioned pillar group, part of the "logical single mark".

It is a further advantageous embodiment of the inventive method to form the pillar group as stack mark. The materials of the pillar group are advantageously adapted to the fabrication steps on the wafer which are to be carried out anyway, and are formed out of oxide or nitride or oxy-nitride or any possible combination thereof. This stack mark describes the usage of several layers of a layer stack which are lying on the substrate prior to the etching of the cavity and which define, in the framework of the lowering of the cavity and the formation of the pillar groups, also the consistency and configuration of each individual pillar which remain standing up at the bottom of the cavity, preferably on the substrate. The layer stack out of several of the above mentioned layers also forms the left-hand and right-hand wall of each cavity. The breadth dimension of the cavity can be described either by means of the rim of the cavity or by means of the wall of the remaining layer stack.

Furthermore, it is advantageous when the alignment marks are produced out of at least a metal layer. At least one metal layer is provided, or the pillars of a pillar group are formed as a pure metal pillar for forming a pure metal mark or a "metallic pillar group". Preferably, no metal layers are used in combination with oxide layers/nitride layers.

The semiconductor wafer which comprises at least two alignment marks which are running perpendicular to each other, is a result of the production process. It is, at the one hand, characterized by method steps which leave their traces in the alignment marks and, on the other hand, by structural elements. An x direction and a y direction define two mutually perpendicular alignment marks. They are each surrounded by a light-opaque layer portion of a deposited layer, and they are embedded therein, are, however, not covered such that an optical detection by an exposure system (or a alignment optics) becomes impossible.

The deposited layer is later on structured or it serves for protecting of at least one optically sensible area of a circuit element outside of the two mutually perpendicular cavities.

A light-opaque layer portion each of the deposited layer fills the mutually perpendicular cavities not completely so that the pillar grooves standing up therein, are not completely covered by the light-opaque layer portion which is allotted to the respective cavity.

A preferred minimum breadth of at least 40 μm is ensued on one side and the other side of a bigger group up to the rim of the cavity or, however, up to the walls of the remaining layer stack which walls define the respective length dimension of the cavities and their rims.

The pillars should be high above 1 μm, preferably in the order of magnitude of a height of 4 μm.

BRIEF DESCRIPTION OF THE DRAWINGS

An example of an alignment mark according to the state of the art and embodiments of the invention are now describes with reference to the drawings.

FIG. 2a shows a new alignment mark as group 16y of pillars according to an embodiment of the invention in top view in y direction in a Y cavity of a Y scribing trench.

FIG. 2b shows the pillar 16 of the pillar group 16y in a section AS-AS of FIG. 2a.

FIG. 3 shows an enlarged top view onto the plurality of pillars 16a to 16d remaining free on top in the layer portion 17y of the light-opaque layer 17.

FIG. 4 shows an enlarged top view of a plurality pillars 16a' to 16f' remaining free on top in a layer portion 17x of the light-opaque layer 17 in a cavity 12x—running perpendicular with respect to FIG. 3.

FIG. 5 shows the cavity 12y with the pillar group 16y after an etching step and prior to the deposition of the light-opaque layer 17 in top view and in section BS-BS (through the pillar 16e).

FIG. 6a shows the structure of FIG. 5, however, in x direction.

FIG. 6b shows the section CS-CS of FIG. 6a through the pillar 16e' of the pillar group 16x in the cavity 12x.

FIG. 7 shows a wafer 100. The thicker lines show scribing trenches. Therein, there are also the alignment marks. Each single chip is surrounded by scribing trenches, for example the chip 100a.

FIG. 7a is a separated chip 100a of the wafer 100 of FIG. 7. It comprises active circuits which may also comprise active optical elements.

DETAILED DESCRIPTION OF EMBODIMENTS

Figure 1:
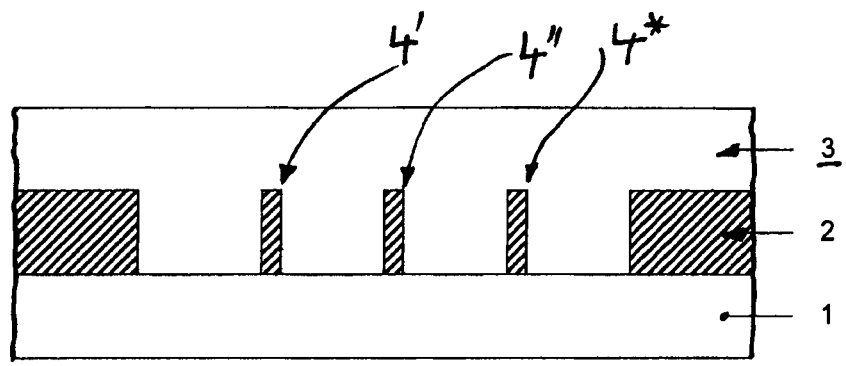
FIG. 1 shows an alignment mark 4 as three groups according to the state of the art as projection groups 4', 4", 4*.

FIG. 1 shows an alignment mark 4—having three parallel projections 4', 4", 4*—according to the state of the art wherein a silicone substrate 1, a unitary layer 2 (i.e. a so-called single layer) for forming the alignment mark 4 and a light-permeable lacquer layer 3 (i.e. photo resist) are shown which has a planar surface so that the alignment mark 4 can be detected only when the lacquer layer is permeable to light. In such systems, the layer thickness of the layer 2 is smaller than 1 μm, so that the projections of the alignment mark are less than 1 μm high. The breadth of each projection usually is 4 μm. The breadth of the cavity 2a is about 90 μm. It is completely filled with the lacquer 3a of the lacquer layer 3 also with lacquer 3b above the projections 4', 4" and 4*.

The structuring of a non-transparent (light-opaque or light-reflective or light-absorbing) layer, for example out of black photo resist on carbon base or pigment base requires other alignment marks. The black photo resist is used as a "light-shielding" or at least light-obstructing layer in order to protect light-sensitive areas of circuits on a semiconductor wafer, or the black photo resist is used as a photo mask in the structuring of one or several circuit element(s). For this purpose, the black lacquer is to be adjusted with respect to the prior layer.

The black lacquer layer is deposited at the end of the fabrication process, for example on a passivation layer. It is a non-transparent, negative photo resist with planarizing properties. Lacquer having a defined thickness, may equalize the existing surface topography. Smaller depressions or cavities are filled up with this lacquer. The result then is a planar surface so that conventional alignment marks are not detected anymore by the alignment optics.

For forming alignment marks according to a first example of the invention, layers present in the process and etching steps are used in that doped or un-doped oxide layer or oxide nitrite layers or nitrite layers or a combination thereof are etched. By using a combination of layers, so-called "stack marks" are produced. Also metal layers can be used for forming the alignment marks, however, not in combination with oxide/nitride layers. For simplicity, it is taken care by means of a adequate mask layout, that no metal is present between the oxide/nitride/oxy-nitride layers.

Preferably, pillar groups of the stack marks have the above-mentioned layers. The pillars originate after an etch step, for example by anisotropic dry etching (RIE). The layer(s) is/are etched down to the silicone substrate for forming of cavities. The "uncovering" of the pillar groups in the cavities is made by an etching step already used in the process, for example, in such a step in which a passivation layer is etched.

Figure 1A:
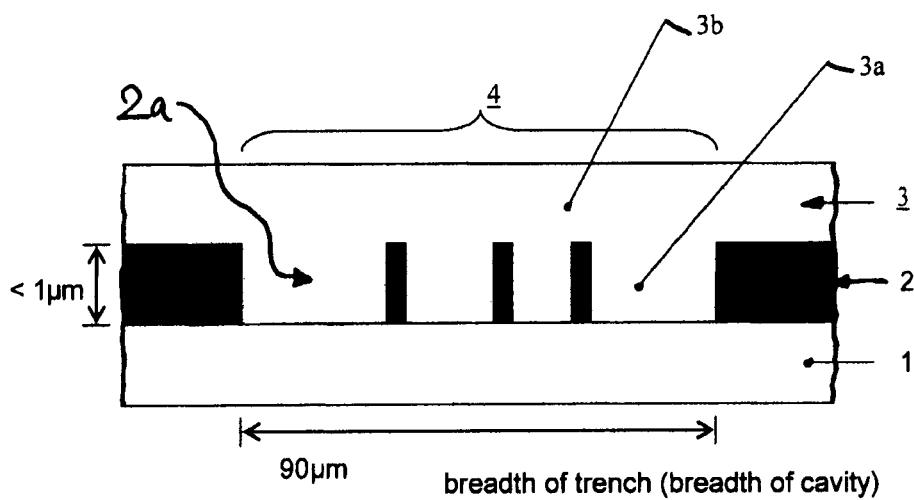
FIG. 1a shows this alignment mark 4 as parallel groups with an explanation of the dimensions of the projections and their distances in the cavity in the photo resist 3.

For the differentiation of the alignment marks from the known alignment marks explained with respective FIGS. 1, 1a, the term of the pillars or pillar groups as defined in the previous paragraph are used. The mark of FIG. 1 comprised only projections, the height of which was less than 1 μm of which several rows were arranged next to each other in the breadth direction of a cavity, in FIG. 1a the cavity 2a. These marks are opulently covered by the transparent photo resist with the layer portion 3b, the cavity 2a was completely filled by the lower layer portion 3a. The two layer portions in the area of the cavity from a part of the completely deposited layer 3 which could only achieve a detectability of the surfaces of the projections 4', 4" and 4* only when having transparency. However, in the following, a non-transparent layer is used also as light-opaque or light-absorbing layer 17. The alignment marks used therein are called pillars wherein a pillar group each consists out of closely neighbouring single pillars arranged in a row. These single pillars are arranged in the longitudinal direction of a cavity which is filled with layer portions 17y of the layer 17 in FIGS. 2a, 2b, however, not completely filled but rather filled only in part. In this respect, FIG. 5 shows that the cavity 12y within which a free standing pillar row 16y remains after the etching process of the cavity which row consists out of six single pillars 16a to 16f in this example.

This pillar row 16y with a single-digit number of individual pillars extends in y direction in parallel to walls 15' and 15" of the cavity 12y. In the section BS-BS through the individual pillar 16e, the lower half picture of FIG. 5 shows the height $h_{16}$ of the pillar 16e and representatively also for the rest of the pillars 16a to 16f of the pillar row 16y which may be used in the completed state as "alignment mark".

Previously, a stack mark has been described, and this configuration of the stack mark is also the one of FIG. 5. It consists out of two layers 15a', 15b', which were part of a layer sequence or a layer stack 15 with two layers 15a and 15b. This layer stack has, in the beginning, no cavity arranged on the substrate 11, and this cavity originates from an etching step in which the pillars of the pillar row 26y remain standing up.

Therein, the pillars receive a breadth $b_{16}$ and a height $h_{16}$, and they stand up on the bottom of the cavity 12y, which is he surface 11a of the substrate 11. The substrate can be a silicone substrate.

The running direction of the "trench" which is named here Y cavity, is shown in FIG. 5. The same direction is to be found also in FIGS. 2a, 2b. There, the trench 12y is filled in part with the light-opaque layer 17 or the layer materials 17y of the layer 17 in the cavity 12y respectively, not up to the surface of the pillar group 16y.

In this example, the pillars are rectangular in cross section which is to be seen from FIG. 3. Besides the breadth $b_{16}$ they also have a length $l_{16}$, and they are distant (however in close neighbourhood), therefore, they respectively stand up freely in the cavity 12y which is to be seen from as FIG. 5 (upper partial picture). A close neighbourhood relation is to be seen there from that the distance between two pillars of a group is smaller than the length $l_{16}$ of a pillar.

Figures 7, 7A:
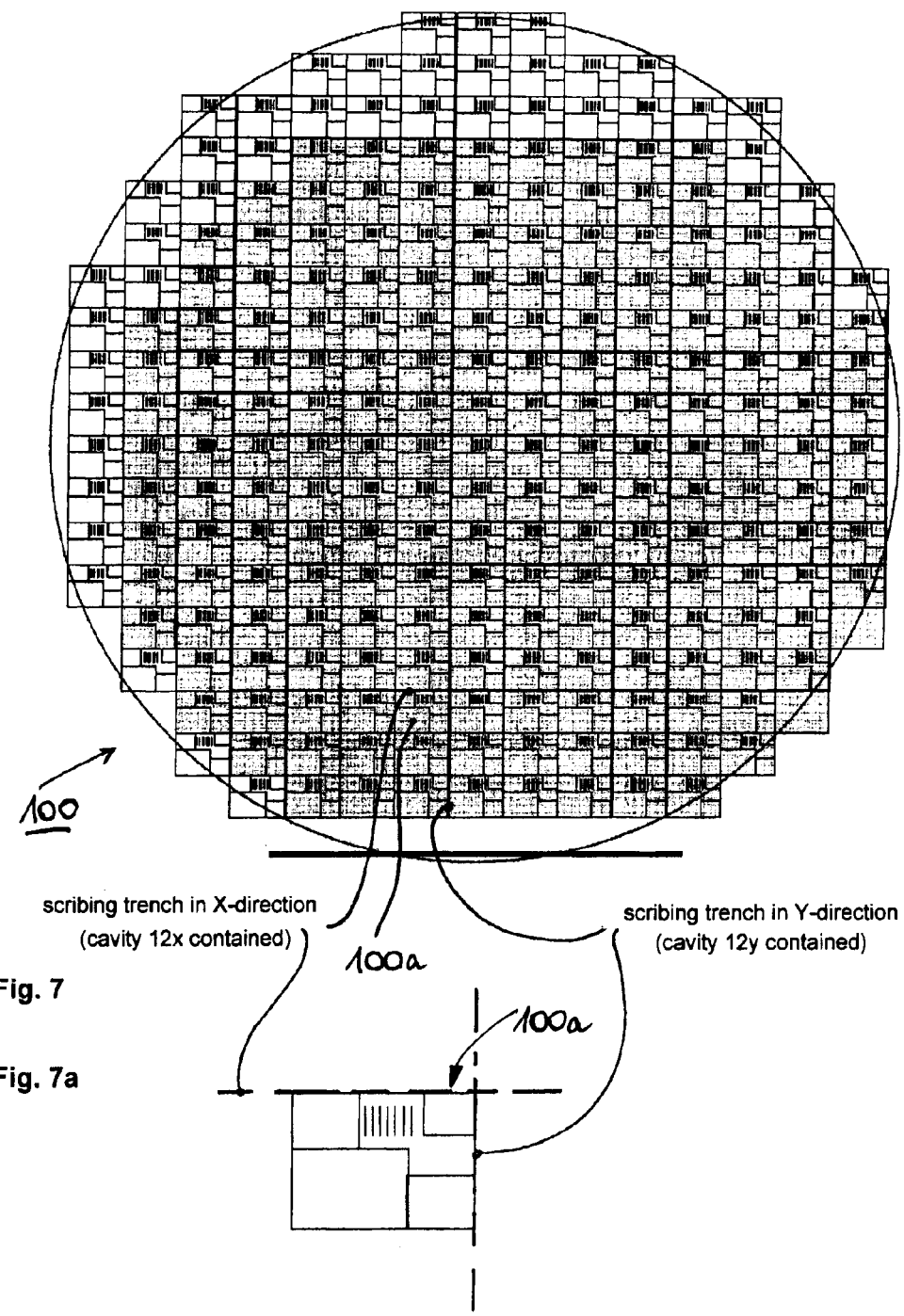

As to the surroundings, it is referred to FIGS. 7, 7a. FIG. 7 shows a wafer 100. This wafer consists of a plurality of single chips arranged next to each other of which one is symbolically taken out as a single chip 100a. Each single chip is limited with respect to the neighbouring single chips by means of scribing trenches. On such scribing trenches, a separation of the single chips with respect to the single chip 100a of FIG. 7a takes place. The scribing trenches extend in x direction and in y direction.

A constituent part of a scribing trench is also a cavity each which extends in the longitudinal direction of the scribing trench and the breadth of which is specified, with respect to its dimensions, smaller than the scribing trench. If the cavity is kept small in its breadth $b_{12}$, also the breadth of the scribing trench can be dimensioned to be small. The scribing trench should be as narrow as possible in order to be able to use the wafer surface in an optimal way for chips.

The cavities in y direction explained with reference to the FIGS. 5 and 2a, 2b, are in the vertical direction of FIG. 7 or FIG. 7a, respectively. The scribing trench running there in a vertical direction, contains the cavity 12y. In this cavity, at least one pillar row 16y is arranged. The x direction and X scribing trench which are orientated perpendicular thereto, contains at least a further pillar row which may be explained with reference to FIGS. 6a, 6b as well as to FIG. 4. This pillar row 16x is perpendicularly arranged with respect to the pillar row 16y, however, but it is physically formed in the same way like the pillar row of the pillars 16a to 16f here, in the pillar row 16x in the x direction, the single pillars 16a' to 16f'. The height $h_{16}$ of the individual pillars of the pillar row 16x according to FIG. 6b is also $h_{16}$. The breadth and the length of the individual pillars is rotated according to their orientation by 90° such that the length distance in the longitudinal direction x of the cavity 12x, and the breadth extends obliquely thereto, which is to be seen from FIG. 6b and the breadth $b_{16}$.

Also here, stack marks are present which are formed according to the arrangement of FIG. 5 just with a correspondingly different orientation. The reference signs x and y point to this, and the explanation with respect to FIG. 5 can also be transferred to FIGS. 6a, 6b with a corresponding change of direction.

As an example of a possible dimensioning of the cavities 12x, 12y, it can be said that a scribing trench has presently a breadth of about more than 100 μm, and that, therein, a breadth $b_{12}$ with 80 μm finds sufficient space in an embodiment. On both the sides of a s pillar row this would mean a distance from the inner wall 15' or 15" respectively, of the remaining layer step of at least 40 μm. The pillar row itself may have an extension in this direction of $l_{16}$ which may be in the range between 2 μm to 5 μm. Preferably, the pillars have an order of magnitude of 4 μm in the breadth direction and, according to the rectangular cross sectional configuration, also an extension $l_{16}$ in longitudinal direction which may comprise the same dimension as the breadth direction.

A relative consideration shows a relationship of essentially 20 between $b_{12}$ and $b_{16}$ or between 8 and 50 at the broadest pillars and the narrowest cavity, or vice versa, respectively.

The height of each pillar in the pillar group 16y and 16x amounts to above 1 μm and is advantageously placed in the range up to 5 μm. Preferred orders of dimensions are around 3 µm such that it is evident that these pillars have an essentially larger extension in height as compared to the projections of FIGS. 1, 1a.

The at least one pillar group 16y in y direction is supposed to be explained after deposition of the light-opaque layer 17 in more detail with reference to FIGS. 2a, 2b and 3. The respective result of the explanation will correspondingly be transferred to the FIGS. 6a, 6b for the x direction wherefrom the detail enlargement of FIG. 4 is resulting for the x direction and the pillar group 16x.

For a cavity 12y or 12x, respectively, a layer portion 17y or 17x, respectively, is symbolically used which, however, is constituent part of a deposited layer 17 which is light-opaque or light-absorbing. In the preferred embodiments, this layer has a thickness of not more as 2,5 µm and should not be below a thickness of 0,8 µm.

After the deposition of the layer 17 on the wafer 100 and thereby, also on top of the cavity 12y and the pillar group 16y of FIG. 5, the picture of the FIGS. 2a, 2b is resulting. The layer 17 has penetrated, in top view, the cavity 12y as a layer and surrounds all single pillars 16a to 16f of the pillar group 16y which extends in the y direction. The section AS-AS is shown in FIG. 2b. It can be seen here that—in the depth direction—the cavity 12y has not been completely filled up, rather only in part. The layer portion 17y of the layer 17 leaves free the surfaces of the single pillars 16a to 16f. It can also be seen at the pillar 16d shown in section. Because of its height $h_{16}$ and the breadth $b_{12}$ of the cavity 12y, a height portion of the cavity 12y remains unfilled and the surface of each single pillar of the pillar group 16y remains optically detectable for a alignment device. This detectability and the absence of the coverage of the surfaces of the pillar group, as it was still the case in the state of the art for FIG. 1, allows the usage of the alignment mark furthermore for the purpose of positioning as it is functionally shown in FIG. 2b.

This "free standing" property of the pillar group 16y results from the breadth of the etched cavity and the pillar row left standing up within with its height dimension. The height dimension is larger than the thickness of the layer portion 17y whereby the outer etch area 12y' near to the vertical wall 15' on the left-hand side and 12y" next to the vertical wall 15" on the right-hand side are not relied upon for the thickness dimensioning of the layer potion 17y. The portions 12y' and 12y" at the left-hand and right-hand rim of the filled up layer portion 17y may extend up to the height of the layer or the layer stack 15 or it lies slightly below this on the one or the other side thereof. This depends on the circumstances of the fabrication process and cannot be defined in this accuracy. The consideration of the surroundings of the pillar group 16y and, in particular, in the respective central area of the left-hand portion and the right-hand portion of the cavity 12y is essential by which it is clearly evident that the deposited layer portions 17y does not reach the height measurement a $h_{16}$ of the single pillars 16a to 16f of the pillar group 16y.

The layer portion 17y of the light-opaque layer 17 filled into the cavity 12y, does not reach, in the central area around the pillar group 16y and in the left-hand and right-hand central area, the height which lies between the surface of the pillars of the pillar group and the bottom 11a of the cavity 12y. Only in the outer rim area 12y' and 12y", the filled in portion 17y can reach such height dimension or also accede it, where this functionally does not contribute to maintaining the optical detectability of the pillar group and, respectively, does not contribute anything detrimental.

The pillar group 16y formed as a stack mark, is shown in section of the pillar 16d consisting out of two layers 15a', 15b' of which at least one layer is an oxide or nitride or oxy-nitride, and the other layer of which comprises a correspondingly different material which is also selected from the above-mentioned group. More than two layers are possible but are not separately shown. The man skilled in the art can easily imaging this with reference to the explanations given here. Also only one single-layer may be provided. One of the layers, for example the layer 15a, can be a passivation layer. It can also extend outside of the shown area to the rest of the active wafer area, and this is also true for the pillars of the pillar group 16x in the same way.

At least one metal layer is also possible, or the formation of the pillar group 16y out of single pillars 16a to 16f which completely consists out of metal. In case a plurality of metal layers is provided, they correspond to the shown layers 15a and 15b. In other words, each of the pillars of the pillar group may comprise at least one metal layer in one embodiment, and this metal layer can be present a plurality of times in the height direction or may extend also completely in the height direction $h_{16}$. This is also true for the pillars of the pillar group 16x.

With respect to the drawings of the FIGS. 5 and 2a, 2b, it has to be supplemented that on both sides of the pillar group 16y, no further pillar groups are arranged in the cavity 12y. The total breadth $b_{12}$ of the cavity, therefore, is divided up, the breadth $b_{16}$ of the pillar group 16y being subtracted, equally to the left-hand and right-hand side. The distance from each inner wall 15' and 15" is, thereby, so large that the layer portion 17y being filled in, does not impair the detectability of the surfaces of the pillars. By such an "non-impairment", also a parasitic coverage of the surfaces of the individual pillars of the pillar group 16y has to be understood which is not larger than 200 nm. Therein, it does not function as being none-opaque for light and maintains the detectability for an alignment device. Also then, the cavity 12y would not be completely filled by the layer portion 17y which is shown by the left-hand and right-hand central areas of FIG. 2b.

Other than in FIG. 1a of the state of the art, only one pillar group 16y is arranged in the breadth direction of the cavity 12y.

The explanation as to the y direction is comparatively to be transferred to FIGS. 6a, 6b. The corresponding picture with filled-in layer portion 17x would be configured like in FIGS. 2a, 2b only with a different orientation and correspondingly different reference signs (x instead of y). The detail enlargement in this respect shows the FIG. 4. The pillar group 16x can here be seen in x direction, which pillar group 16x is surrounded by the layer portion 17x which has been filled in into the cavity 12x and with a constituent part of the layer 17. The pillars 16a' to 16f' remain optically detectable in spite of the fact that they are surrounded by light-opaque layer material 17x and are embedded therein. Their surfaces are, however, maintained not completely covered, at the most purely parasitic with a maximum residual layer thickness of 200 nm in the surface area of the layer portions 17x so that they remain optically detectable further on. The remaining portion is not light-opaque because of its transmission.

The pillar rows 16x and 16y are arranged at different locations. They are aligned in different directions which is easily to be seen in FIG. 7 and FIG. 7a. The detail magnification of the FIGS. 3 and 4 shows two different locations in two mutually perpendicular cavities, however, they show two logically associated pillar groups 16x, 16y which remain useable as "logical alignment mark" for alignment optics. At least one such pair allows a successful alignment or positioning by the alignment optics. Also a plurality of such pairs may be formed at further different locations such that one group of logical alignment marks is resulting, however, the arrangement can preferably operate with only one pair according to FIGS. 3 and 4.

Two such single marks on the semiconductor wafer in the scribing trench areas for the x and y direction would be used by an alignment optics in order to reliably achieve the positioning.

A logical alignment mark comprises, however, at least two mutually perpendicular pillar rows or to mutually perpendicular "alignment marks" one of which is adjusted in the y direction and the other one in the x direction, however, not at the same location.

The logical association of two single marks does not say anything about their physical association. By example, the y-single mark may be arranged in an y-scribing trench and the x-single mark may be arranged in the next x-scribing trench.

We claim:

1. A method for the production of an alignment mark on a semiconductor wafer using a light-absorbing layer for a subsequent structuring or for the protection of at least one light sensitive area of a circuit element, comprising:
   etching at least one cavity in at least one layer on a substrate of a semiconductor wafer thereby forming a group of pillars in the at least one cavity;
   depositing the light-absorbing layer in the at least one cavity around the formed group of pillars;
   wherein the cavity is etched with a breadth so that it is no more than partially filled after the deposition of the light-absorbing layer; and
   wherein the formed group of pillars is shaped as pillar row having a height that is greater than a thickness of the deposited light-absorbing layer in the at least one cavity so that upper surfaces of the pillars of the formed group of pillars are not covered by the light-absorbing layer.

2. The method according to claim 1, wherein at least one of the cavities is etched around a respective group of pillars and around each individual pillar of the group of pillars down to the substrate of the semiconductor wafer.

3. The method according to claim 1, wherein no passivation is carried out after the deposition of the light-absorbing layer.

4. The method according to claim 1, wherein a respective group of pillars is produced as a row and receives a height of above 1 μm to 5 μm by corresponding lowering of the cavity within which the pillar row is standing up or remains standing up.

5. The method according to claim 4, wherein the group of pillars is assigned a height of at least 3 μm, and this being the height of each pillar of the group above a bottom of the cavity.

6. The method according to claim 1, wherein each pillar of the group of pillars is manufactured with a length of 2 μm to 5 μm.

7. The method according to claim 3, wherein each pillar of the group of pillars has a length of 2 μm to 5 μm.

8. The method according to claim 1, wherein the cavity has a breadth dimension of at least 80 μm on one side of the group of pillars and at least 40 μm on the other side of the same group of pillars.

9. The method according to claim 1, wherein the light-absorbing layer is deposited with a thickness of 0.8 μm to 2.5 μm.

10. The method according to claim 1, wherein at least one group of pillars is formed as a single mark.

11. The method according to claim 1, wherein two mutually perpendicular pillar groups are each formed as single marks.

12. The method according to claim 1, wherein a respective pillar group is formed as a stack mark comprising one or more layers per pillar.

13. The method according to claim 11, wherein a respective group of pillars is produced out of layers of oxide or nitride or oxy-nitride or a combination thereof.

14. The method according to claim 1, wherein a respective group of pillars comprises at least one metal layer or is a pure metal mark.

15. The method according to claim 1, wherein a respective group of pillars consists of a row of single pillars.

16. The method according to claim 1, wherein, in between the group of pillars and a left-hand or a right-hand rim of the cavity, no other group of pillars is standing up or is fabricated.

17. The method according to claim 1, wherein in between the pillar group and a left-hand and a right-hand wall of the at least one layer, no other pillar group formed.

18. The method according to claim 1, wherein each pillar comprises a thin layer of the light-absorbing layer having thickness that is less than 200 nm.

19. The method according to claim 18, wherein the light-absorbing layer on the pillar is configured to permit an exposure system to detect the alignment mark surface.

20. The method according to claim 1, wherein the at least one layer comprises a layer stack on the substrate is provided and the layer stack, is etched with a photo mask.

21. The method according to claim 20, wherein the layer stack is etched with an etching step for etching a passivation layer, whereby the passivation layer is a layer of one of the layer stack and outside of the layer stack on the semiconductor wafer.

22. The method according to claim 1, wherein the light-absorbing layer is a carbon-based black resist.

23. A method for the production of at least two alignment marks on a semiconductor wafer, wherein, by etching at least two mutually perpendicularly arranged cavities are formed, and therein at least one pillar group usable as alignment mark remains standing up, wherein
   the pillar groups are produced with a height above 1 μm, and being larger than the thickness of a light-absorbing layer portion of a layer to be deposited in the respective cavity;
   the cavities are formed with such a width that they are not filled up more than in part upon depositing the light-absorbing layer portions;
   the light-absorbing layer is deposited on the wafer for one of structuring and protecting of at least one circuit element outside of the cavities.

24. The method according to claim 23, wherein the cavities are each produced in a breadth of at least 80 μm, or wherein each cavity is essentially twenty times broader than the breadth of a pillar group as alignment mark provided therein.

25. The method according to claim 21, wherein the layer stack is etched together with etching of the passivation layer.

26. The method according to claim 1, wherein the at least one layer is selected from the group of an dielectric dielectric, an inter-metal dielectric and a passivation layer.

27. The method according to claim 8, wherein the cavity has a breadth dimension of at least 80 μm.

* * * * *

UNITED STATES PATENT AND TRADEMARK OFFICE
CERTIFICATE OF CORRECTION

PATENT NO. : 8,722,506 B2
APPLICATION NO. : 13/139002
DATED : May 13, 2014
INVENTOR(S) : Steffen Reymann, Gerhard Fiehne and Uwe Eckoldt It is certified that error appears in the above-identified patent and that said Letters Patent is hereby corrected as shown below:

In the Claims

Column 14, Claim 13, Line 7 which reads:

"The method according to claim 11, wherein a respec-"

should be corrected to read:

"The method according to claim 10, wherein a respec-"

Signed and Sealed this
Ninth Day of December, 2014

Michelle K. Lee
*Deputy Director of the United States Patent and Trademark Office*

UNITED STATES PATENT AND TRADEMARK OFFICE
CERTIFICATE OF CORRECTION

PATENT NO.       : 8,722,506 B2                                      Page 1 of 1
APPLICATION NO. : 13/139002
DATED            : May 13, 2014
INVENTOR(S)      : Reymann et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 15 days.

Signed and Sealed this
Twenty-ninth Day of September, 2015

Michelle K. Lee
*Director of the United States Patent and Trademark Office*